United States Patent
Vogman

(10) Patent No.: US 7,492,171 B2
(45) Date of Patent: Feb. 17, 2009

(54) SYSTEMS AND ARRANGEMENTS FOR SENSING CURRENT WITH A LOW LOSS SENSE ELEMENT

(75) Inventor: Viktor Vogman, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 220 days.

(21) Appl. No.: 11/477,846

(22) Filed: Jun. 29, 2006

(65) Prior Publication Data

US 2008/0018402 A1 Jan. 24, 2008

(51) Int. Cl.
*G01R 27/08* (2006.01)
(52) U.S. Cl. .................................. 324/721; 324/705
(58) Field of Classification Search .................. 324/721, 324/705, 76.11
See application file for complete search history.

(56) References Cited

U.S. PATENT DOCUMENTS 5,663,667 A * 9/1997 Blum et al. ................. 327/134
6,046,556 A * 4/2000 Cargille ................. 318/400.04
2007/0274015 A1* 11/2007 Isham ....................... 361/93.1

* cited by examiner

Primary Examiner—Vincent Q Nguyen
(74) Attorney, Agent, or Firm—Schubert Osterrieder & Nickelson PLLC

(57) ABSTRACT

One arrangement includes a sense element to convey a current from a source to a load and a compensation element located proximate to the sense element. The compensation element having a resistance that changes proportional to a change in temperature of the sense element. The arrangement further includes an operational amplifier having a first input connected to the sense element, a second input connected to the compensation element and an output that provides an output signal that biases a current through the compensation element in response to a voltage across the sense element. The bias current provides an output signal proportional to the conveyed current and the compensation element provides temperature compensation for the output signal. Other embodiments are also disclosed.

16 Claims, 6 Drawing Sheets

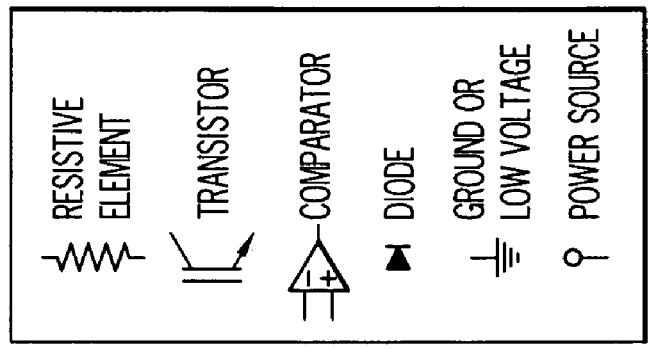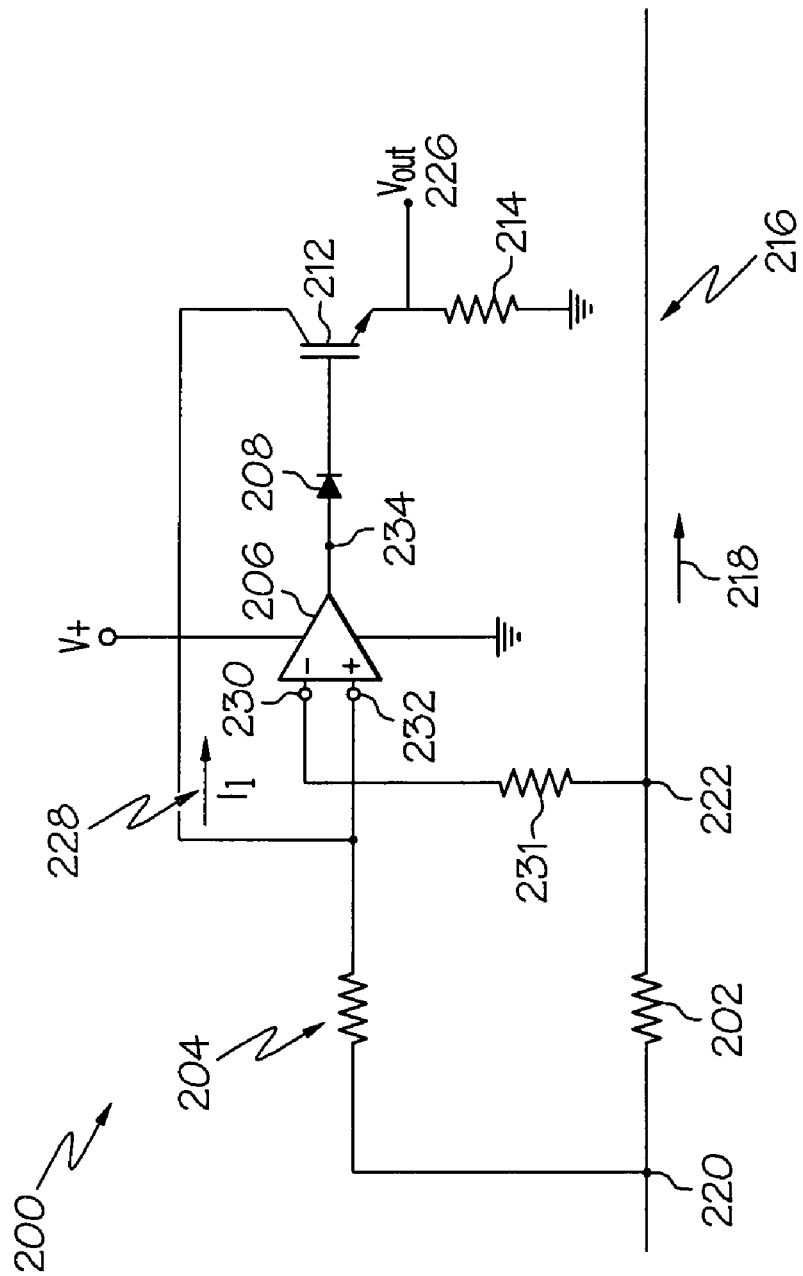
FIG. 2

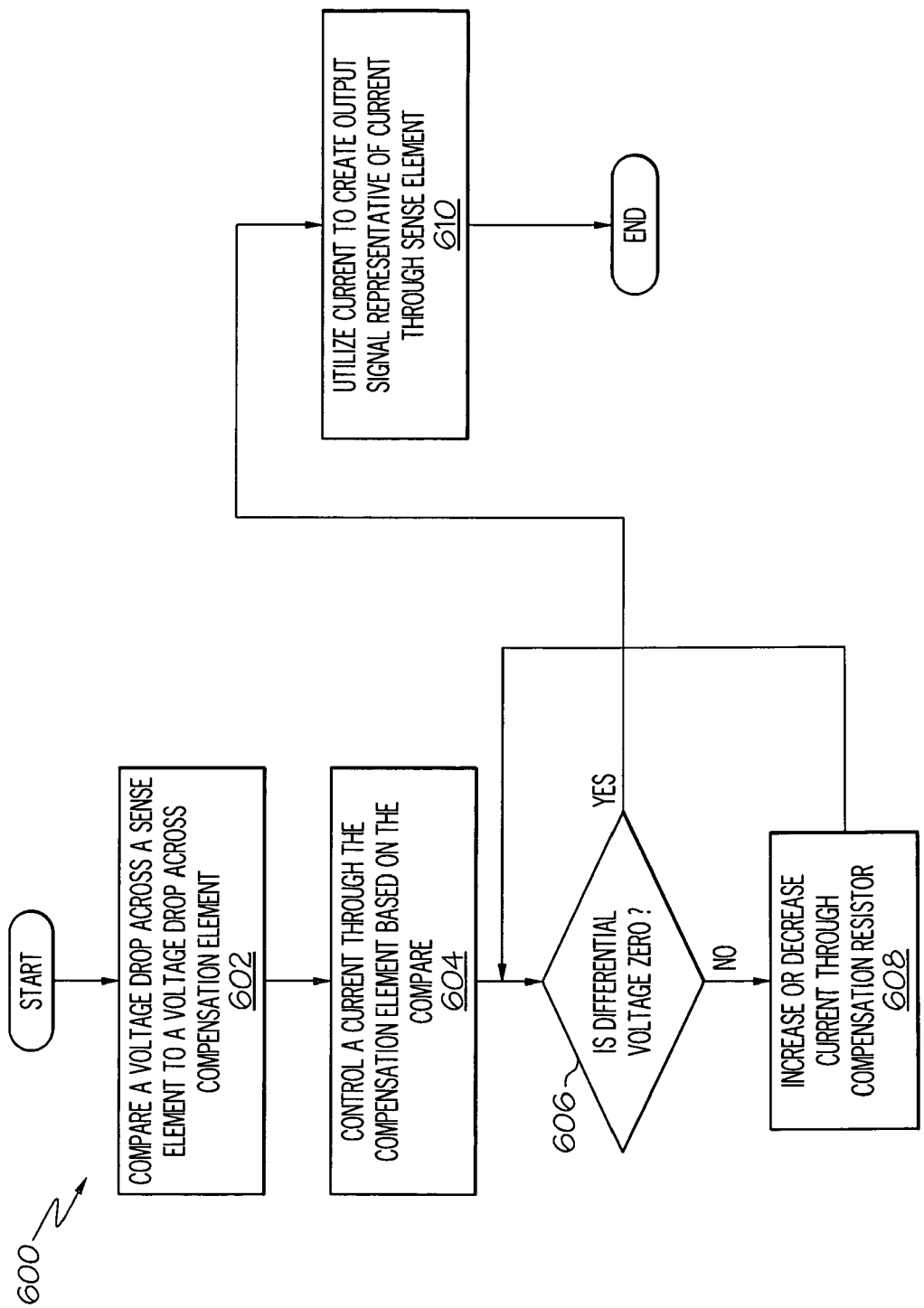

SYSTEMS AND ARRANGEMENTS FOR
SENSING CURRENT WITH A LOW LOSS
SENSE ELEMENT

FIELD

The present disclosure relates generally to electronic circuits. More particularly, embodiments of the present disclosure are related to the field of sensing current utilizing a low loss current sensing element.

BACKGROUND

Electronic devices such as computers, personal digital assistants (PDA)s, radiotelephones, telecommunications equipment, servers and the like continue to evolve as manufacturers of such devices continue to improve the speed, size, functionality, battery life and longevity of these devices. In such devices it often important to know how much current is being supplied by, or consumed by circuits, sub-circuits and components within the device. These components are typically mounted on a circuit board that interconnects the components utilizing copper traces that are "sandwiched" between layers of insulating circuit board material. During the manufacture of circuit boards, the copper traces can be selectively etched from sheets of copper that are affixed to the insulating layers thereby forming traces.

There are many circumstances where it is desirable to be able to accurately detect relatively high currents in a circuit. The ability to accurately monitor large currents allows for better control of circuit operation. For example, providing precision currents in a battery charging process can greatly increase battery life for battery powered devices. Determining if circuits or components are drawing excessive power can lead to measures that control these circuits such that they draw less power. Such control can greatly increase the reliability of electronic devices. Detecting current can also pinpoint systems and components that are malfunctioning or overheating and such systems can be shut down to avoid a catastrophic failure.

Traditional current sensing systems that sense relatively high currents introduce many design problems and have limited accuracy. For example, the power resistor typically utilized in current sensing systems will typically produce a significant voltage drop in the power line, consume a significant amount of power and the resistance of such a device can change with temperature at an unpredictable rate making an accurate current reading nearly impossible. Thus, a designer is almost always faced with the design challenge of introducing an intrusive power loss and compensating for an intrusive voltage drop. The design challenges in current sensing technology have intensified with the new, low voltage standards. Some electrical components now require high currents at very low supply voltages. Current standards include power requirement of three and a third volts (3.3V) and one volt (1V).

Most traditional current sensing methods insert a precision resistor in series with a power line and the voltage sensing circuits measures the voltage drop across the sense resistor to determine the current. For larger currents, a current sense circuit requires a precision, low resistance, high power resistor. Precision resistors are relatively expensive and today the lowest commercially available resistance value in a precision resistor is a 1 milliohm having a 1% deviation. Often, there is a very little margin to accommodate the voltage drop that is inherent in traditional current sensing resistors in traditional current sensing configurations. Some electronic components such as a microprocessor can require as much as 100 amps at one volt, with extreme voltage sensitivity. For example, if a power trace supplies a regulated one (1) volt supply voltage at one hundred (100) Amps to a microprocessor, the voltage drop across the current sense resistor will reach one hundred (100) millivolts which is 10% of the supply voltage. Thus, in such a design, 10% of the power is wasted on determining how much current the microprocessor is drawing and due to the intrusive voltage drop, the power supply or a voltage regulator module needs to regulate out this voltage drop to ensure proper operation of the microprocessor.

BRIEF DESCRIPTION OF THE DRAWINGS

FIG. 2 illustrates one embodiment of a current sensing circuit coupled to a power delivery system;

FIG. 6 is a flow diagram illustrating a method for sensing current in a circuit.

DETAILED DESCRIPTION OF EMBODIMENTS

Figure 1:
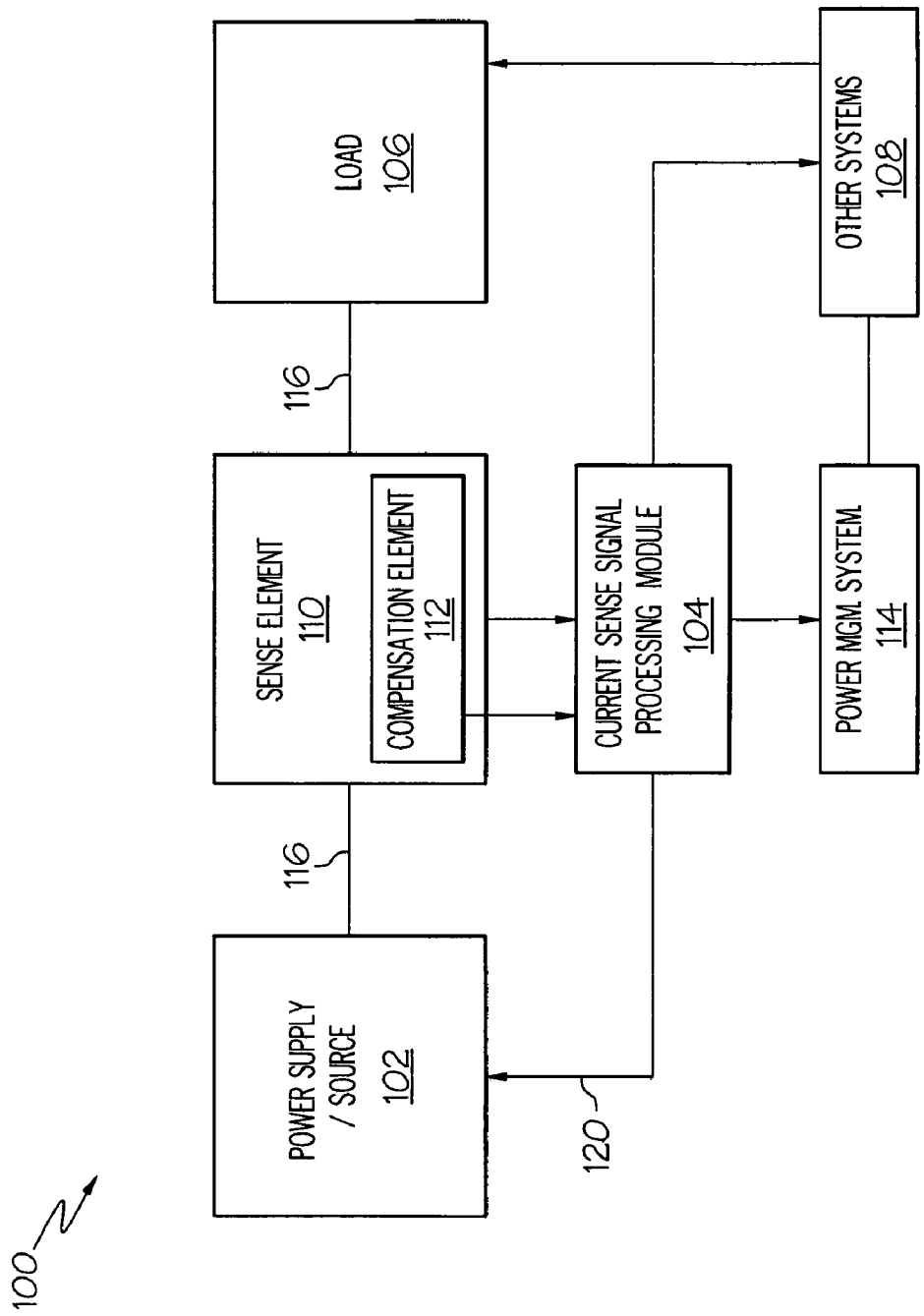
FIG. 1 depicts an embodiment of a power delivery system with current sensing capabilities.

The following is a detailed description of embodiments of the disclosure depicted in the accompanying drawings. The embodiments are introduced in such detail as to clearly communicate the disclosure. However, the embodiment(s) presented herein are merely illustrative, and are not intended to limit the anticipated variations of such embodiments; on the contrary, the disclosure is to cover all modifications, equivalents, and alternatives falling within the spirit and scope of the appended claims. The detailed descriptions below are designed to make such embodiments obvious to those of ordinary skill in the art.

In accordance with the present disclosure a current sensing apparatus is disclosed. The apparatus can include a sense element to convey a current from a source to a load, the sense element can have a resistance that changes proportional to a change in its temperature. A compensation element can be located proximate to the sense element and due to their close proximity the compensation element can have a resistance that changes proportional to a change in temperature of the sense element. This feature virtually eliminates measurement errors due to thermal drift. The apparatus can include an operational amplifier (OPAMP) having a first input coupled to the sense element, a second input coupled to the compensation element and an output providing a signal that is proportional to a voltage measured between the first input and the second input. The apparatus can also include an output module having an input coupled to the output of the OPAMP, an input coupled to the compensator element and an output to provide an output signal responsive to the voltage measured at the OPAMP inputs, which is an indicator of the current through the sense element and any error created by thermal drift.

In another embodiment, a method to sense current is disclosed. The method can include sensing a voltage drop across a sense element based on a first current through the sense element wherein the first current is a current to be sensed. A second current can be drawn through a compensation element responsive to the voltage drop, wherein the resistance of the compensation element can change with the temperature of the sense element such that the second current is based on the current through the sense element and the temperature of the sense element. The second current can be utilized to provide an output signal proportional to the first current such that a low loss, accurate current sense system is disclosed. Utilizing a compensation element that tracks the change in resistance of the sense element can virtually eliminate design issues associated with temperature deviation.

A method for manufacturing a current sensing system is also disclosed. A first trace can be etched on a first layer of a printed circuit board to form a current sense element. The current sense element can create a first voltage in response to an applied current. An insulator can be placed on the first trace to electrically isolate the first trace. A second trace can be etched on a second layer of the printed circuit board. The second trace can form a temperature compensation element. The temperature compensation element can have a resistance that creates a second voltage in response to a bias current, wherein the bias current is controlled by voltage. The first trace and second trace can be placed in close proximity to each other such that a change in the temperature of the sense element creates corresponding change in temperature of the compensation element and correspondingly the current through the compensation element will change. In this manner temperature changes that normally invoke substantial inaccuracies in current sense elements can be minimized as relatively large currents can be accurately sensed over a wide temperature range utilizing the disclosed method.

Referring to FIG. 1, a power system 100 is illustrated that includes a power source or power supply 102 that supplies a current to a load 106 via power conductors 116 and sense element 110. The load 106 could be nearly any type of circuit, sub circuit or component that draws power. For example, the load 106 could be a microprocessor, a logic circuit, a memory circuit, a battery, a communication circuit such as a transmitter or a circuit that processes data.

A sense element 110 can have a compensation element 112 overlaid or superimposed on it with the elements 110 and 112 located in close proximity to each other such that during operation they have similar temperatures. The elements 110 and 112 can be coupled to current sense signal processing module 104. The current sense signal processing module 104 can utilize the voltage across the sense element 110 to determine the current carried by power line 116, and to provide feedback via feedback line 120 to the power supply 102. The current sense signal processing module 104 can also provide control signals to a power management system 114 and to other systems 108. All of the mentioned components can be mounted on a printed circuit board and interconnected via circuit traces on the circuit board.

The sense element 110 can have a very low impedance, possibly in the micro ohm range, such that during operation at relatively high currents, a voltage drop that is very low, but measurable is created across the sense element 110. Correspondingly, only a relatively small voltage drop and very little power dissipation will occur in such a configuration. The sense element 110 could be a circuit trace or possibly a copper wire utilized in a winding of a power supply filter both providing a relatively low DC resistance. Thus, the sense element can utilize existing circuit components to create the voltage drop and can provide a small but measurable voltage drop between an input terminal and an output terminal of the sense element 110 when current passes through sense element 110.

A compensation element 112 can be superimposed on, or placed in close proximity to, the sense element 110 such that the temperature of the compensation element 112 can track the temperature of the sense element 110 and accordingly the voltage drops across the devices can have an equivalent change due to changes in temperature. Thus, the inaccuracies due to thermal drift can be virtually eliminated during circuit operation.

Power management system 114 can utilize an output signal from the current sense signal processing module 104 to control operation of other systems 108 such as a battery management system (not shown). In another embodiment, if a load such as a microprocessor is drawing too much current then the speed of the microprocessor clock can be slowed based on instructions from power management system 114 and correspondingly the current draw of the processor (or the load 106) and the heat produced by the microprocessor can be decreased.

The power supply 102 can provide a precision voltage on power line 116. In one embodiment, the power supply 102 can be a switching power supply or a voltage regulator module that can utilize a current based feedback signal on feedback line 120 to precisely monitor and control the output voltage. When the load 106 draws excessive current, the feedback signal can be utilized to provide a soft shut down to avoid a failure. Further, if the power supply 102 is required to provide power in excess of its capacity for a long duration which can result in over heating, the power supply 102 can utilize the current based feedback signal to shut itself down and avoid a catastrophic failure of circuit components, the load 106, and the power supply 102.

Referring to FIG. 2, a particular embodiment of a current sensing system 200 is depicted. The current sensing system 200 can include a sense element 202, a compensation element 204, an OPAMP resistor 230, an OPAMP 206, a diode 208, an output transistor 212, and an output bias resistor 214. Nearly all electrical components have an inherent equivalent series resistance. Sense element 202 and compensation element 204 are drawn as resistors to represent an equivalent series resistance of a device that may provide other operational features. For example, the sense element 202 and the compensation element 204 can be a copper trace on a circuit board. The trace can be sized to produce a minimal resistance with the anticipated operational current and the trace can "double" as a sense element 202. The trace or sense element 202 can be designed to have a very low resistance value at the operation current. The sense element 202 can be part of, and in series with a power conductor 216. Compensation element 204 can be placed in close proximity to the sense element 202. Such proximity of the elements 202 and 204 allows the elements 202 and 204 to maintain a similar temperature and thus exhibit similar changes in voltage drops due to a change in temperature.

Sense element 202 can be manufactured with the same copper alloy as compensation element 204. Thus, as sense element 202 heats up from current, or from a rise in ambient temperature, compensation element 204 will heat up accordingly, and the resistance of elements 204 and 202 and the voltage drop across elements 202 and 204 can change at substantially the same rate. Thus, the change in resistance of sense element 202 due to temperature is tracked by the change in resistance of compensation element 204, virtually eliminating inaccuracies that typically manifest in traditional systems. Additionally, changes in resistance of a sense element can introduce a significant error when a low resistance sense element 202 is utilized with a relatively high current.

In operation, a current 218 through sense element 202 creates a voltage drop across the sense element 202. Accordingly, the voltage at node 220 will be higher than the voltage at node 222 based on the relatively small voltage drop across sense element 202. The larger the current through sense element 202, the larger the voltage drop across sense element 202. Thus, the voltage at the non-inverting node 230 of the OPAMP 206 will be determined by current 218.

A relatively high current can flow through the copper trace or sense element 202 and the resistance of sense element 202, (R(202)) will create a voltage drop defined by current (218) times R(202). Because the input current of OPAMP 206, (i.e. the current through OPAMP resistor 231) is negligible as compared to the current through sense element 202, the voltage V230 at the inverting input node 230 of OPAMP 206 can be described in terms of I 218 (the load current flowing through sense element 202), and the voltage at node 230 (V230), as;

$$(V230)=V(220)-(I(218) \times R(202))$$

The response of the OPAMP 206 attempts to equalize the voltage on nodes 230 and 232 of the OPAMP 206 (i.e. V230 and V232). Thus, as the voltage V230 on node 230, (i.e. on the inverting input of the OPAMP 206) decreases due to an increased current 218 on power line 216, the voltage on the output of the OPAMP 206, or on node 234 will rise, driving the current 228 higher, and in turn driving the voltage on node 232 (at the non-inverting input of the OPAMP 206) lower until it matches the voltage on node 230. Likewise, as the voltage on node 230 increases due to a lower current on the power line 216, the voltage on output node 234 will decline, reducing the current 228, thus increasing the voltage on the node 230 until it matches the voltage at node 232.

A higher voltage at node 234 increases the bias on the emitter follower configuration (output transistor 212 and output resistor 214) pulling down the voltage at the non-inverting input of the OPAMP 206 and increasing the voltage drop across the compensation element 204. Since the base current of the output transistor 212 and the input bias currents to the OPAMP 206 are very small as compared to the emitter and collector current I(228) of the output transistor 212, an equation representing the balance of the voltage drops across the compensation element 204 having a resistance R204 and the sense element 202 having a resistance R204 can be written as follows: $I(218) \times R202 = I(228) \times R(204)$. (EQ. 1). This makes the voltage drop across the compensation element 204 equal to the drop across the sense element 202 and the OPAMP input resistor 231. R214 is the resistance of resistor 214 and solving equation 1, EQ. 1, above for I(228) provides $I(228) = (I(218) \times R202)/R204$. The voltage drop across output resistor $214 = V_{sense} = I228 \times R(214) = [I(218) \times R(202) \times R(214)]/R(204)$, (EQ. 2).

In a specific embodiment, printed circuit board traces, represented by sense element 202 and compensation element 204 are exposed to the same temperature and are made of the same material, such that they have the same thermal coefficient, and thus provide an equal drift in resistance and voltage drop. This equivalent drift cancels temperature dependent variables in equation 2 (EQ2) above, and makes the voltage at the output node 226 directly proportional to the load current 218. In other embodiments, process variations may change characteristics of some or both such that, the drift in resistance and voltage may vary to an extent.

To provide a further reduction in temperature sensitivity OPAMP resistor 231 can be a thermally stable resistor. In one embodiment, OPAMP resistor 231 can be greater than ten ohms possibly twenty or thirty ohms. Since the current through OPAMP resistor 231 is typically very small (on the order of a few micro amps) even a substantial change in the resistance value of the OPAMP resistor 231 due to changes in temperature will not substantially affect the voltage drop across the OPAMP resistor 231 and correspondingly the voltage at node 230.

The diode 208 can protect the junction of the output transistor 212 particularly when the loading on the output node 226 is a capacitive load. In this configuration the output voltage may increase beyond the maximum allowable base to emitter reverse voltage and when this happens the diode 208 can provide such voltage protection and avoid damage to the junction when the monitored current rapidly changes from high level to low. However, for low output signal levels on the output node 226 not exceeding two to three volts, the diode 208 may not be necessary and could be eliminated or replaced with a jumper.

Assuming steady state operation, any increase in current 218 will attempt to increase the voltage differential across the input terminals of OPAMP 206. In response, the OPAMP 206 will provide an increased voltage on its output and this increased voltage will increase the bias voltage on transistor 212 (turning the transistor on harder) which will allow more current 228 to flow through the transistor 212 and through compensator element 204. The output signal Vout 226 will increase in voltage until the voltage drop across compensator element 204 becomes equal to the cumulative voltage drop across sense element 202 and OPAMP resistor 231, wherein the voltage drop is negligible across the OPAMP resistor. The currents and voltages will stabilize when the voltages become equal at the inputs of the OPAMP 206.

The voltage at output node 226 can provide an output signal that varies proportional to the current 218 through the sense element 202. The sense element 202 is in close proximity to compensation element 204 allowing the resistance of, and the voltage across the two elements (i.e. 202 and 204) to drift in an equivalent manner attenuating errors typically caused by temperature variations.

Figure 3:
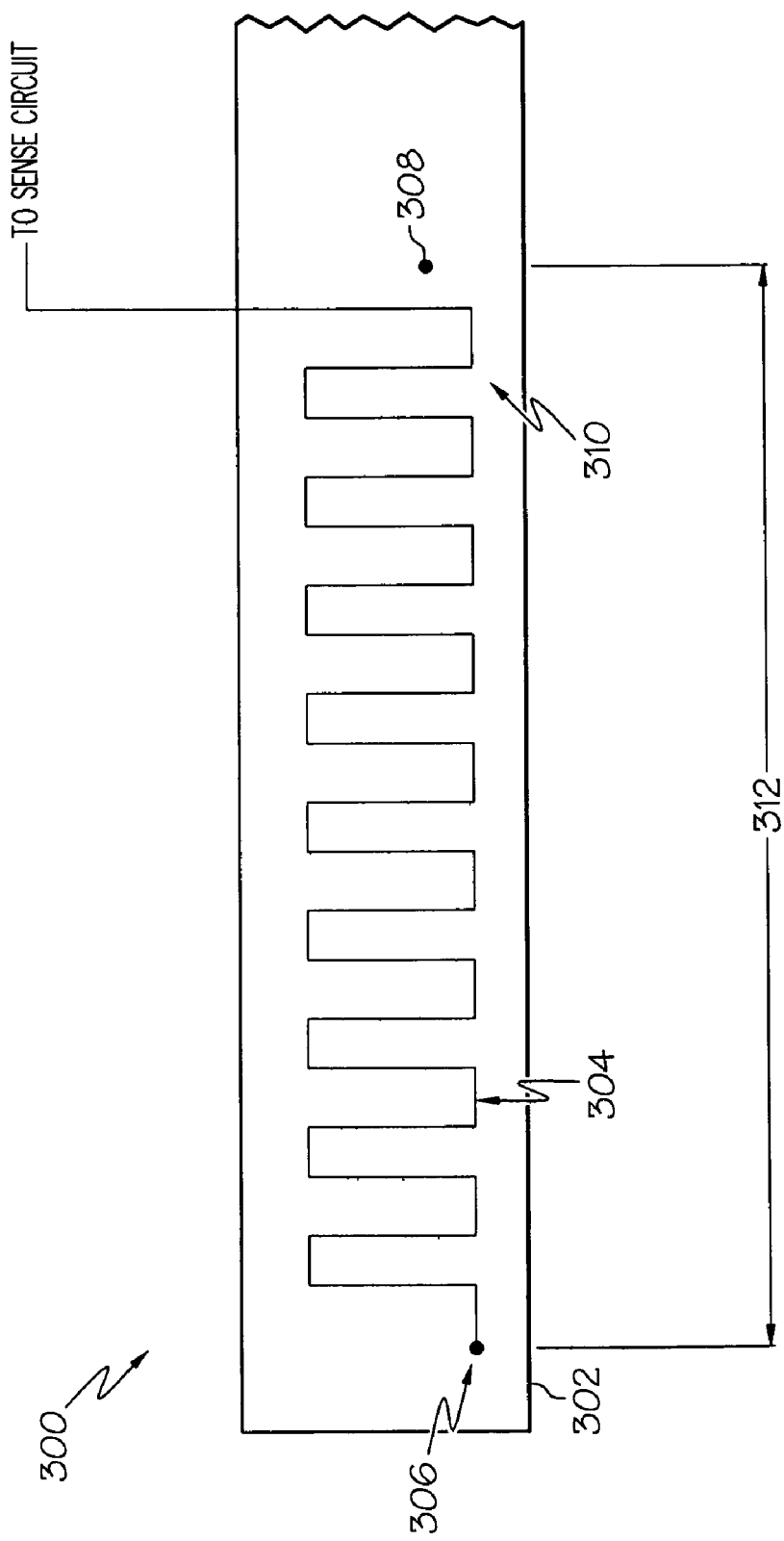
FIG. 3 depicts a current sensing configuration having a compensation element superimposed on a current sense element.

Referring to FIG. 3, a circuit trace embodiment of a sense element 302 and a smaller circuit trace embodiment of a compensation element 304 is disclosed. All conductors have some resistance, and generally the more cross sectional area of the conductor, the less the resistance of the conductor. Thus, the sense element 302 can be a circuit trace sized according to the amount of current that it will carry in a particular design. For example, a trace such as trace 312 circuit can be designed to safely accommodate currents of over 100 amps while providing a voltage drop in the tens of millivolts range. Thus, the amount of resistance that is desired for the specific circuit design can dictate the cross sectional area of the circuit trace sense element 302. The sense element 302 can have a relatively large cross sectional area to safely accommodate large currents and thus sense element 302 can provide a low resistive loss during operation. In one embodiment, a resistance between node 306 and node 308 can be on the order of a few hundred microhms.

A plated through hole at node 306 can electrically connect the sense element 302 to compensation element 304, at a single location. An insulator 310 can be placed between the sense element 302 and the compensation element 304 to electrically insulate the sense element 302 from the compensation element 304 at locations other than the plated through hole at node 306. The sense element 302 or trace can be sized such that it can accommodate a high current that will pass through the trace and provide the desired voltage drop. A substantially narrower and longer trace can be fabricated on top of the insulator 310 to create compensation element 304. Compensation element 304 can have a significantly higher resistance. It conducts a much lower "compensation" current than the sense element 302, such that the voltage drop on the narrower trace (the compensation element 304) is on the order of the voltage drop across the sense element 302. Thus, although their currents are significantly different, the sense element 302 and the compensation element 304 can have voltage drops that are substantially similar. For example, the voltage drop across the sense element 302 and the voltage drop across compensation element 304 can be on the order or a few tens of millivolts.

One way for the compensation element achieve such a resistance and such a voltage drop is to make the compensation element 304 narrow and relatively long by "zigzagging" the conductive traced across the sense element 302 multiple times from a first through hole at node 306 towards a second through hole at node 308 along the length 312 of the sense element 302. Overlaying the compensation element 304 over the sense element 302 ensures that these elements have the same, or nearly the same temperature during operation. The sense element 302 and the compensation element 304 can be made from materials having the same or substantially the same thermal properties such that they will exhibit the same or substantially the same voltage changes due to changes in current and temperature.

In the manufacture of the sense element 302 and the compensation element 304 the sense element 302 can be etched on an interior layer of the printed circuit board and the compensation element 304 can be etched on an adjacent circuit board layer. Thus, insulating layer 310 can be placed between the sense element 302 and the compensation element 304. The insulating layer 310 can be placed to electrically insulate the current sense element 302 from the compensation element 304, however, if reduced thermal insulation properties are desired, a material such as mica could be utilized as an insulator. Insulating the elements 302 and 304 from each other is relatively easy, because of the relatively low voltage differential between the elements 302 and 304. Thus, a simple circuit board masking material may also be utilized.

The resistance between node 306 and node 308 can be described mathematically as R(302)(between Node 306 and Node 308)=$((0.658 \times \ln (L/d))/\pi \times Th)$ where the resistance in milliohms is measured between node 306 and node 308, L is the length of the trace, d is the diameter of the plated through hole, and "Th" is the thickness of the element 302 (thickness of the printed circuit board conduction layer). To calculate the voltage drop across the compensation element 304, V(304)=I(304)$\times$R(304)$\times$(1+$\alpha$R2$\times$$\Delta$t) where R(304) is the resistance of the compensation element 304, I(304) is the current through the compensation element 304, $\alpha$=the temperature coefficient of the compensation element 304 and $\Delta$t=the change in temperature. Such a calculation can be utilized in determining what size of trace could be utilized to design a trace for given design parameters.

Figure 4:
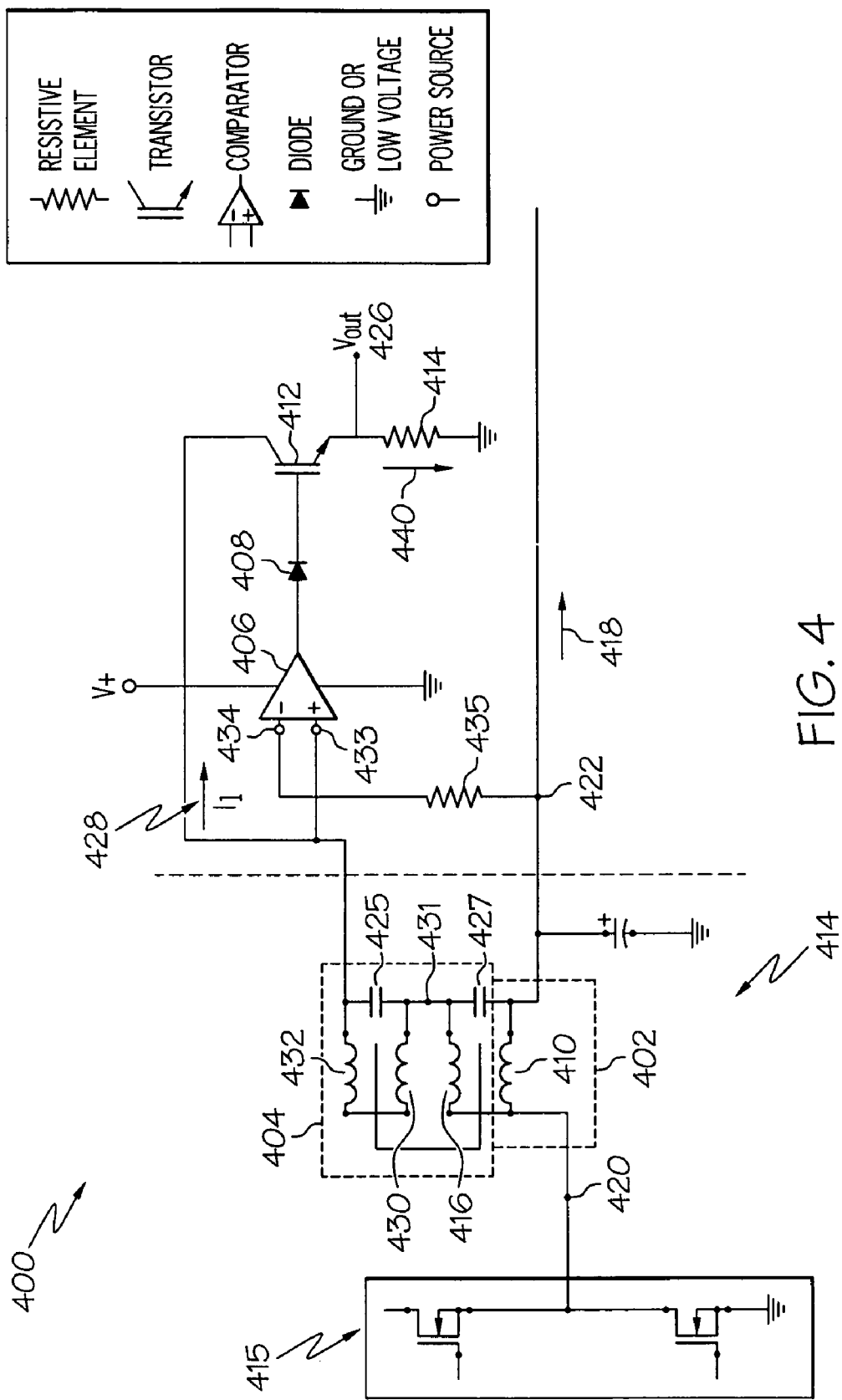
FIG. 4 illustrates another embodiment of a current sensing circuit.

Referring now to FIG. 4 an alternate embodiment of a current sensing system 400 is disclosed. This embodiment includes a sense element 402, a compensation element 404, an OPAMP resistor 435, an OPAMP 406, a diode 408, an output transistor 412, and an output bias resistor 414. The sensing system 400 is similar to the one described in FIG. 3 however, the resistive sense element of FIG. 3 is embodied as the equivalent series resistance (ESR) of an existing winding 410 around a core, that provides filtering of AC components generated at the switching node 420. Thus, the sense element 402 can be windings 410 around a ferromagnetic core wherein the windings are placed in series with the power line. In accordance with the present disclosure, the winding 410 can be utilized to create a relatively low resistance and relatively small voltage drop for a sensing circuit to process and provide an output signal that is proportional to the sensed current.

The power source 415 can be a boost converter, a buck converter, a boost buck converter, or a voltage regulator module (VRM) that utilizes an output filter having a winding 410. As stated above, the winding 410 can double as a sense element 402 and additional compensation windings 416, 430, and 432 can perform as a compensation element 404. Since a signal from the compensation element 404 and from the sense element 402 both feed the OPAMP 406, the compensation winding 416 can be wound such that any alternating current (AC) or ripple voltage that is generated by the primary winding 410 is cancelled by the magnetic fluxes in the core. The sense windings 416, 430 and 432 can be wound in a series configuration and oriented such that all AC components cancel each other and do not manifest at the output 426 of the system 400. The "winding based" sense element 402 and compensation element 404 provide some additional features than those provided by the "trace type" elements of FIG. 3. For example, possible design problems may arise if currents are too high for a circuit trace or there is not an adequate amount of room on a circuit board for a large trace. As stated above, a choke or output filter is often present and the windings of the choke can be utilized as a current sense element and eliminating the need for a circuit trace design.

When design requirements dictate that the voltage across the sense element 302 (FIG.3) is relatively low, for example it does not exceed a few millivolts, and the signal to noise ratio of the sense element 302 is not high enough to affect accurate monitoring, the implementation of the wound sense element 402 and the wound compensation element 404 (FIG.4) may provide improved performance over the circuit trace implementation of FIGS. 2 and 3. Implementing an inductor or a copper wire as the sense element 402 and the compensation element 404 can provide some space saving advantages in a switching power supply environment because windings are present in most switching power supplies. Thus, the existing windings of an output choke or output inductor of a switching power supply can provide a low series resistance comparable to the traces described with reference to FIGS. 2 and 3. In this embodiment, all of the current monitoring circuitry can be located proximate to the power supply 414.

The system 400 can also incorporate a temperature and AC compensation feature by incorporating windings 416, 430 and 432. Winding 416 can compensate for AC components across winding 410. Windings 430 and 432 can compensate for the thermal drift of the resistance value (the ESR) of the sense winding 410. The inputs and outputs of the compensation element 404 can be connected such that the AC signals across the compensation element 404 and the sense element 402 will cancel. This makes the windings of the sense element 402 and the compensation element 404 appear to the OPAMP 406 as purely resistive elements. Alternately described, due the direction of turns of the windings 430 and 432, the AC voltage generated across winding 430 will have one polarity and the AC voltage generated across winding 432 have an opposite polarity, thus, during operation, because these windings are connected in series the AC components will cancel each other. Accordingly, they will be relatively little, if any resulting AC voltage at the non-inverting input of the OPAMP 406.

Winding 410 performs as a current sense resistor (or element) providing a resistance created by the ESR of copper wire of the winding 410. The impedance of the compensation windings 416, 430 and 432 generally will not affect the ESR or DC voltage drop across the sense element 402 because the current flowing through compensation element 404 is negligible as compared to the load current flowing through winding 410. Thus, no appreciable voltage drop is induced on winding 410 by sense windings 416, 430 and 432. As with the printed circuit trace embodiment above, the ESR of the windings of the compensation element 404 can have the same thermal coefficients and can be placed in close proximity (i.e. the same physical environment) as the windings of the sense element 402.

In operation, the relatively high load current I418 through the primary winding 410 creates a voltage drop across the winding 410 due to the ESR (R410) of the primary winding 410. Although the output voltage (voltage at node 420, V420) of the power supply 414 has a dominating AC content, the voltage at node 422 can be maintained at a relatively constant level. If voltage at node 422 is regulated (maintained constant by the power supply feedback loop) the voltage at node 431 can be described as V431=V422+(I(418)×R(410), where: V422 is the voltage at node 422, I418 is the load current 418 and R410 is the ESR of the sense element or in this case primary winding 410. Similarly to the description of FIG. 3 above, the voltage V431 will increase in response to an increase in the load current. The voltage at the output of OPAMP 406 will also increase. This will forward bias the base-emitter junction of the transistor 412, turning it on harder, and additional collector current will flow through the compensation element 404 (windings 430 and 432). This in turn will pull down the voltage on node 433 or the non-inverting input of the OPAMP 406, making voltage at node 433 equal to the voltage at non-inverting input 434 of OPAMP 406. An equation representing balance of the voltage drops across compensation windings 430+432 and 410+416 may be written as follows:

$$I428 \times [ESR(430) + ESR(432)] = I418 \times ESR(410) + I428 \times ESR(416) \cong I418 \times ESR(410)$$

Solving this equation for I418, we get:

$$I428 = [I418 \times ESR(410)] / [ESR(430) + ESR(432)].$$

The sensed voltage represented by a voltage drop across output resistor 414:

$$V\text{sense} = [I418 \times ESR(410) \times R414] / [ESR(430) + ESR(432)].$$

All of the windings 410, 416, 430 and 432 in the sense element 402 and the compensation element 404 can be made from the same material, (i.e. a copper alloy) and since the windings 410, 416, 430 and 432 are all exposed to the same temperature, the thermal drift in resistance and resulting voltage drops will drift the same amount in the same direction and thus Vout (426) provides an output signal that is virtually unaffected by changes in temperature. Additional temperature stabilization can be achieved by utilizing a thermally stable emitter resistor 414. Capacitors 425 and 427 can filter any excess noise that may be associated with leakage inductance of the windings 410, 416, 430 and 432. Thus, accurate and thermally stable current monitoring is achieved when a circuit trace or a filter is utilized as a current sense element without the intrusion of a lossy, expensive sense element in a high current path. A possible operating point for the system 400 is I(418)=120A and V A(420)–B(422)=30 mV. With the commonly available components, the current sense circuits in FIGS. 2 and 4 above can provide a dynamic error that is less than 0.7%, and a static error of 0.5%.

Figure 5:
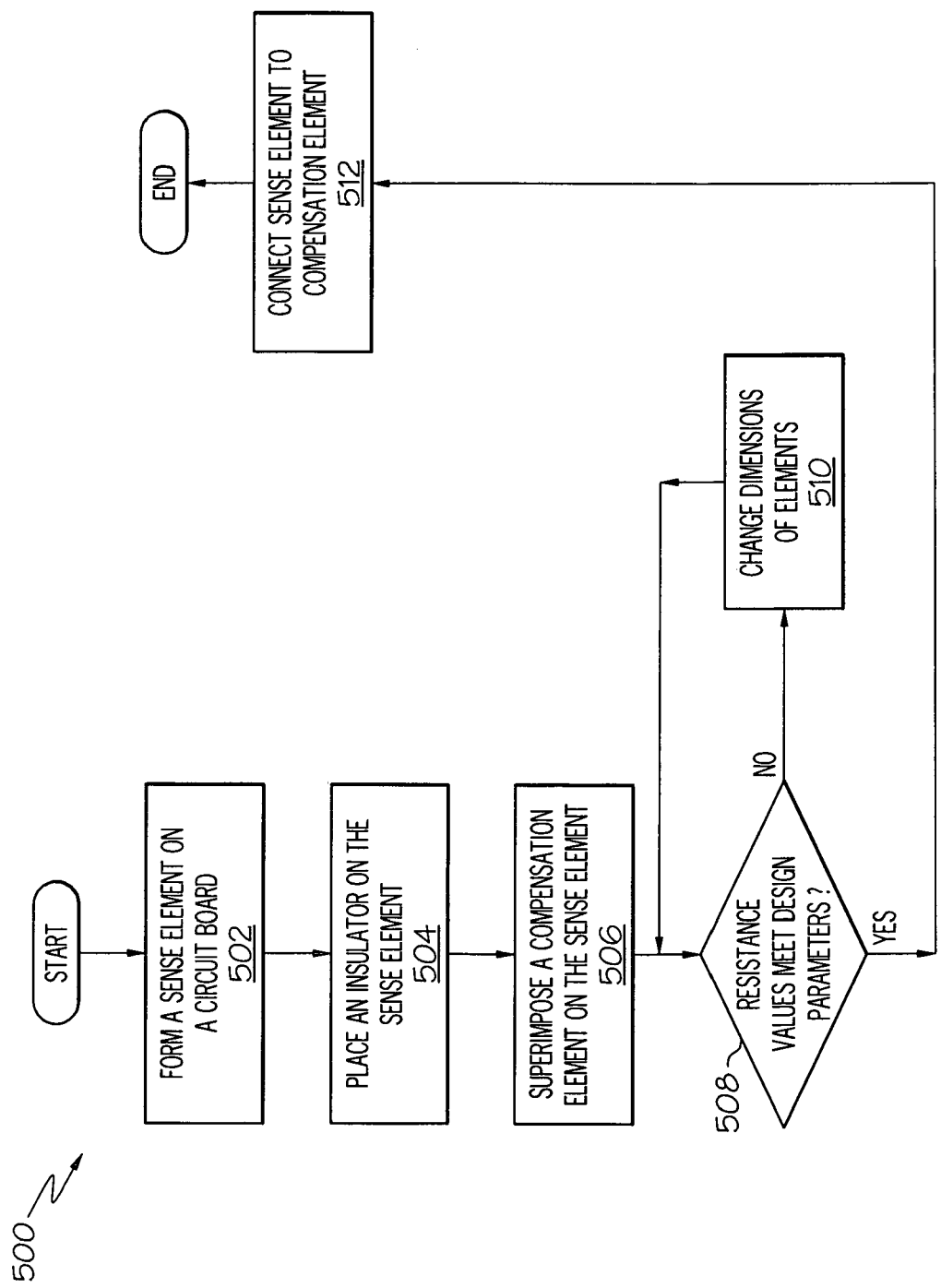
FIG. 5 is a flow diagram illustrating a method for creating a sense element and a compensation element.

Referring to FIG. 5, a flow chart 500 disclosing a method for manufacturing a sense element and a compensation element such as the elements described in FIG. 3 is disclosed. As illustrated by block 502 a current sense element can be formed on a circuit board. The current sense element can be a circuit trace that is etched from a copper plate secured to an insulative layer of circuit board material such as a layer of polyamide. An insulator can be placed over the sense element as is illustrated by block 504.

A compensation element can be superimposed or overlaid on the sense element as is illustrated by block 506. The compensation element can have a significantly higher resistance than the sense element. In one embodiment, during operation, a similar voltage drop can be achieved across the two elements, when the sense element conducts a current that is magnitudes larger than the current through the compensation device. Thus, in one embodiment it is desirable for the compensation element to be much narrower and much longer than the sense element such that the compensation element has a resistance that is significantly larger that the resistance of the sense element.

As is illustrated by decision block 508, utilizing the design current parameters it can be determined if the current through the sense element will create a voltage that is similar to a voltage created by an operational current through the compensation element as illustrated by block 508. When the desired design parameters are not met, the widths and the lengths of the elements can be alter as illustrated by block 510 and the process can revert back to decision block 508. When the desired design parameters are met then the sense element can be connected to the compensation element as illustrated by block 512.

Referring to FIG. 6 a flow chart 600 depicting a method for sensing a current and providing an output signal that is proportional to the sensed current is disclosed. As illustrated by block 602, a voltage drop across a sense element can be determined and a voltage drop across a compensation element can be determined and these voltage drops can be compared by an OPAMP. In one embodiment, the voltage drop across the sense element can include a relatively small voltage drop across an OPAMP bias resistor.

The output of the OPAMP can automatically drive a transistor that controls the current through the compensation element based on the compared voltages as is illustrated by block 604. Accordingly, controlling the current alters a voltage at an input terminal of the OPAMP such that the controlled current is representative of the sensed current. At decision block 606 it can be determined if the differential voltage is zero. If the differential voltage is zero then the output current can be utilized to provide a signal representative of the current through the sense element as illustrated by block 610. When at block 608 it is determined that the differential voltage is not zero then the OPAMP can increase or decrease its output voltage and consequently the current through the compensation resistor will be increased or decreased as illustrated by block 608. The process can revert back to block 606 to determine if the differential voltage is zero. When, the differential voltage is zero the current through the output transistor can be utilized to indicate a current through the sense element as is illustrated in block 610.

The present invention and some of its advantages have been described in detail for some embodiments. It should be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. One of ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A circuit comprising:
   a sense element to convey current from a source to a load, the sense element having a resistance to change in response to a change in temperature of the sense element;
   a compensation element located proximate to the sense element, the compensation element having a resistance to change in response to the change in the temperature of the sense element;
   an operational amplifier having a first input coupled to the sense element, a second input coupled to the compensation element and an output wherein the operational amplifier to provide a signal on the output proportional to a voltage measured between the first input and the second input; and
   an output module having a first input coupled to the output of the operational amplifier, a second input coupled to the second input of the operational amplifier and an output to provide an output signal responsive to the current conveyed from the source to the load and the temperature of the sense element.

2. The circuit of claim 1, further comprising a diode having a first lead coupled to the output of the operational amplifier and a second lead coupled to the first input of the output module.

3. The circuit of claim 1, further comprising an operational amplifier input resistor coupled to the first input of the operational amplifier and to the sense element.

4. The circuit of claim 1, wherein the output module, in response to a voltage drop across the sense element to conduct a reference current through the compensation element and provide an output signal that is proportional to the current conducted from the source to the load.

5. The circuit of claim 4, wherein the output module comprises an output bias resistor to create a reference voltage from the reference current.

6. The circuit of claim 5, wherein the output bias resistor has a resistance of greater than ten ohms.

7. The circuit of claim 1, wherein a resistance value of the sense element is less than 500micro ohms.

8. The circuit of claim 1, wherein the compensation element comprises at least two windings of a wire around a ferromagnetic core such during operation alternating current components are canceled by the at least two windings.

9. The circuit of claim 1, wherein the operational amplifier comprises a comparator.

10. The circuit of claim 1, wherein the output module comprises an emitter follower configuration.

11. The circuit of claim 1, wherein the output module comprises a bipolar transistor.

12. The circuit of claim 1, wherein the sense element comprises a trace on a circuit board.

13. The circuit of claim 1, wherein the sense element comprises a wire wound on a ferro-magnetic core.

14. The circuit of claim 1, wherein the compensation element comprises a trace on a circuit board.

15. The circuit of claim 1, wherein the compensation element comprises a wire wound on a ferromagnetic core.

16. The circuit of claim 1, wherein the compensation element is superimposed on the sense element.

* * * * *

UNITED STATES PATENT AND TRADEMARK OFFICE
CERTIFICATE OF CORRECTION

| | |
|---|---|
| PATENT NO. | : 7,492,171 B2 |
| APPLICATION NO. | : 11/477846 |
| DATED | : February 17, 2009 |
| INVENTOR(S) | : Viktor Vogman |

It is certified that error appears in the above-identified patent and that said Letters Patent is hereby corrected as shown below:

In column 12, line 15, in Claim 7, delete "500micro" and insert -- 500 micro --, therefor.

Signed and Sealed this

Fourteenth Day of April, 2009

JOHN DOLL
*Acting Director of the United States Patent and Trademark Office*